(12) United States Patent
Akarvardar et al.

(10) Patent No.: US 9,536,990 B2
(45) Date of Patent: Jan. 3, 2017

(54) METHODS OF FORMING REPLACEMENT FINS FOR A FINFET DEVICE USING A TARGETED THICKNESS FOR THE PATTERNED FIN ETCH MASK

(71) Applicants: GLOBALFOUNDRIES Inc., Grand Cayman (KY); International Business Machines Corporation, Armonk, NY (US)

(72) Inventors: Murat Kerem Akarvardar, Saratoga Springs, NY (US); Jody A. Fronheiser, Delmar, NY (US); Bruce Doris, Slingerlands, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 58 days.

(21) Appl. No.: 14/727,458

(22) Filed: Jun. 1, 2015

(65) Prior Publication Data
US 2016/0351681 A1    Dec. 1, 2016

(51) Int. Cl.
*H01L 29/66* (2006.01)
*H01L 29/78* (2006.01)

(52) U.S. Cl.
CPC ....... *H01L 29/6681* (2013.01); *H01L 29/7848* (2013.01)

(58) Field of Classification Search
CPC ............. H01L 29/6681; H01L 29/7848; H01L 29/66795; H01L 29/785; H01L 21/76224; H01L 21/823412; H01L 21/823431
See application file for complete search history.

(56) References Cited

U.S. PATENT DOCUMENTS

| 2014/0213031 | A1  | 7/2014 | Lin et al. | |
|---|---|---|---|---|
| 2015/0024573 | A1* | 1/2015 | Jacob | H01L 29/66628 438/424 |
| 2015/0035113 | A1  | 2/2015 | Chen et al. | |
| 2015/0097243 | A1  | 4/2015 | Ontalus et al. | |
| 2015/0118805 | A1  | 4/2015 | Rideau et al. | |

OTHER PUBLICATIONS

Notice of Allowance from related U.S. Appl. No. 14/727,364 dated Jan. 21, 2016.

(Continued)

*Primary Examiner* — Kyoung Lee
(74) *Attorney, Agent, or Firm* — Amerson Law Firm, PLLC

(57) ABSTRACT

One method disclosed herein includes, among other things, forming a patterned fin having a thickness that is equal to or greater than a target final fin height for a replacement fin, performing an etching process through the patterned fin etch mask to form a plurality of trenches in a semiconductor substrate to define a substrate fin and forming a recessed layer of insulating material in the trenches so as to expose the patterned fin etch. The method also includes forming a layer of CTE-matching material around the exposed patterned fin etch mask, removing the patterned fin etch mask to thereby define a replacement fin cavity and expose a surface of the substrate fin, forming the replacement fin on the substrate fin and in the replacement fin cavity, removing the layer of CTE-matching material and forming a gate structure around at least a portion of the replacement fin.

24 Claims, 12 Drawing Sheets

(56) References Cited

OTHER PUBLICATIONS

Bashir et al., "Characterization of sidewall defects in selective epitaxial growth of silicon," Journal of Vacuum Science & Technology B, 13:923-27, May/Jun. 1995.

Sherman et al., "Elimination of the Sidewall Defects in Selective Epitaxial Growth (SEG) of Silicon for a Dielectric Isolation Technology," IEEE Electron Device Letters, 17:267-69, Jun. 1996.

* cited by examiner

METHODS OF FORMING REPLACEMENT FINS FOR A FINFET DEVICE USING A TARGETED THICKNESS FOR THE PATTERNED FIN ETCH MASK

BACKGROUND OF THE INVENTION

1. Field of the Invention

Generally, the present disclosure relates to the manufacture of FET semiconductor devices, and, more specifically, to various methods of forming replacement fins for a FinFET device using a targeted thickness for a patterned fin etch mask.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speeds of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of trenches 13, three illustrative fins 14, a gate structure 16, sidewall spacers 18 and a gate cap layer 20. An insulating material 17, e.g., silicon dioxide, provides electrical isolation between the fins 14 and effectively determines the final active fin height. The gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of all or a portion of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects and off-state leakage. When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating alternative semiconductor materials, such as so-called SiGe, Ge and III-V materials, to manufacture FinFET devices, which are intended to enhance the performance capabilities of such devices, e.g., to enable low-voltage operation without degrading their operating speed.

FIG. 1B is a perspective view of an illustrative prior art FinFET semiconductor device 10, wherein the overall fin structure of the device includes a substrate fin portion 14A and an alternative fin material portion or replacement fin 14B. As with the case above, the substrate fin portion 14A may be made of silicon, i.e., the same material as the substrate, and the replacement fin 14B may be made of a material other than the substrate material, for example, silicon-germanium. As noted above, the use of such alternative fin materials improves the mobility of charge carriers in the device.

However, the integration of such alternative materials on silicon substrates (the dominant substrates used in the industry) is non-trivial due to, among other issues, the large difference in lattice constants between such alternative materials and silicon. That is, with reference to FIG. 1B, the lattice constant of the replacement fin 14B may be substantially greater than the lattice constant of the substrate fin portion 14A of the fin 14. As a result of this mismatch in lattice constants, an unacceptable number of defects may be formed or created in the replacement fin 14B. As used herein, a "defect" essentially refers to a misfit dislocation at the interface between the substrate fin portion 14A and the replacement fin 14B or threading dislocations that propagate through the replacement fin 14B at well-defined angles corresponding to the (111) plane.

One of the proposed approaches for the formation of replacement fins 14B comprised of alternative materials for FinFET devices will now be discussed with reference to FIGS. 1C-1I, which are cross-sectional views of the fins taken in a gate width direction of the device 10. As shown in FIG. 1C, the initial substrate fin structures 14 are formed in the substrate 12 by performing an etching process through a patterned etch mask 15. FIG. 1D depicts the device 10 after the layer of insulating material 17 was deposited in the trenches 13, after a relatively high temperature anneal process (e.g., 900° C.+) was performed so as to densify the insulating material 17 and one or more CMP processes were performed to remove the etch mask 15 and excess amounts of the layer of insulating material 17. These operations expose the upper surface of the fins 14. Silicon dioxide is frequently used as the material for the layer of insulating material 17. Silicon dioxide has a linear coefficient of thermal expansion (CTE) of about 0.5 (E-6/° K) whereas a silicon substrate has a CTE of about 2.6 (E-6/° K). The difference in the CTEs of the materials causes a compressive force 17X to be exerted on the substrate fins 14 when the local oxide fill material 17 is annealed.

Next, as shown in FIG. 1E, a timed recessing etching process is performed to remove an upper portion of the initial substrate fins 14 (now denoted as fins 14A) such that they have a recessed upper surface 14R. The removal of a portion of fins 14 results in the formation of a plurality of replacement fin cavities 19 that are defined, at least partially, by the insulating material 17. FIG. 1E depicts an idealized situation wherein the shape of the replacement fin cavity 19 corresponds approximately to that of the removed portion of the substrate fin 14. However, that is not the case in at least some real-world applications. As shown in FIG. 1F, in practice, once the upper portions of the substrate fins 14 are removed, the insulating material 17 tends to expand, thereby reducing the size of the original fin cavities 19, that have been renumbered 19A to reflect this change in configuration. The insulating material 17 expands in an effort to reduce the compressive force 17X that was present in the layer of material 17 when it was formed in the trenches 13, annealed and restrained by the original substrate fins 14 (prior to the removal of the upper portion of the substrate fin 14). FIG. 1G is a SEM photograph showing the configuration of the modified fin cavities 19A after the upper portion of the substrate fin 14 is removed.

As shown in FIG. 1H, the replacement fins 14B that are formed in these modified fin cavities 19A will also have a cross-sectional configuration that corresponds approximately to the cross-sectional configuration of the modified fin cavities 19A, which is an undesirable profile for the replacement fin 14B. The replacement fin material 14B is grown on the recessed fin structures 14A by performing a selective epitaxial deposition process. The replacement fin 14B may be comprised of a variety of materials, e.g., $SiGe_{0.25}$ (CTE of about 3.4), Ge (CTE of about 5.8), etc. Due to the mismatch between the CTEs of the insulating material 17 (e.g., silicon dioxide with a CTE of about 0.5) and the replacement fin 14B material (e.g., $SiGe_{0.25}$ with a CTE of about 3.4), an unacceptable number of defects or faults may be formed in the replacement fin 14B during the epitaxial deposition process and the subsequent cool down.

FIG. 1I is a SEM photograph that shows the formation of the angled stacking faults or defects 21 in the replacement fin 14B. The angled stacking faults or defects 21 appear to originate at the interface between the replacement fin 14B and the insulating material 17. In this example, substrate fin 14A is made of silicon, the replacement fin 14B is made of $SiGe_{0.25}$ and the layer of insulating material 17 is a HARP silicon dioxide. The formation of such defects or faults 21 makes the replacement fin 14B less desirable from a performance point of view.

The present disclosure is directed to various methods of forming replacement fins for a FinFET device using a targeted thickness for a patterned fin etch mask that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement fins for a FinFET device using a targeted thickness for a patterned fin etch mask. One illustrative method disclosed herein includes, among other things, forming a patterned fin etch mask above a semiconductor substrate, the patterned fin etch mask having a thickness that is equal to or greater than a target final fin height for a replacement fin, performing an etching process through the patterned fin etch mask to form a plurality of trenches in the semiconductor substrate so as to define a substrate fin, with the patterned fin etch mask in position, forming a layer of insulating material in the trenches, and recessing the layer of insulating material so as to expose the patterned fin etch mask above a recessed upper surface of the layer of insulating material. In this example, the method also includes the steps of forming a layer of CTE-matching material around the exposed patterned fin etch mask and above the recessed upper surface of the layer of insulating material, the layer of CTE-matching material having a CTE that is within ±20% of the replacement fin CTE, removing the patterned fin etch mask so as to thereby define a replacement fin cavity in at least the layer of CTE-matching material and expose a surface of the substrate fin, forming the replacement fin on the substrate fin and in the replacement fin cavity, removing the layer of CTE-matching material and forming a gate structure around at least a portion of the replacement fin.

BRIEF DESCRIPTION OF THE DRAWINGS

The disclosure may be understood by reference to the following description taken in conjunction with the accompanying drawings, in which like reference numerals identify like elements, and in which.

Figure 1A:
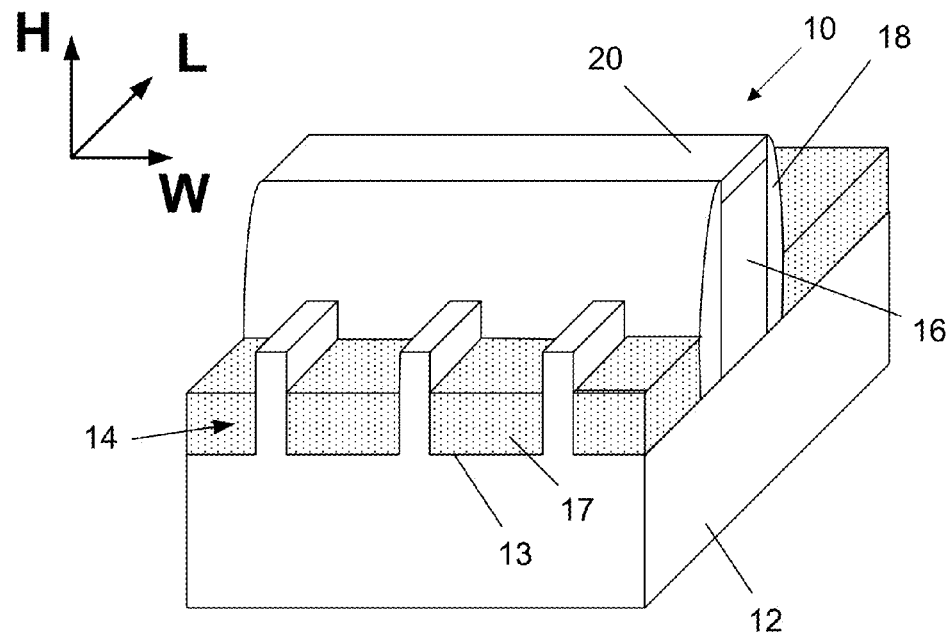
FIG. 1A depicts an example of prior art FinFET devices wherein the fins for the device are comprised of the substrate material.
Figure 1B:
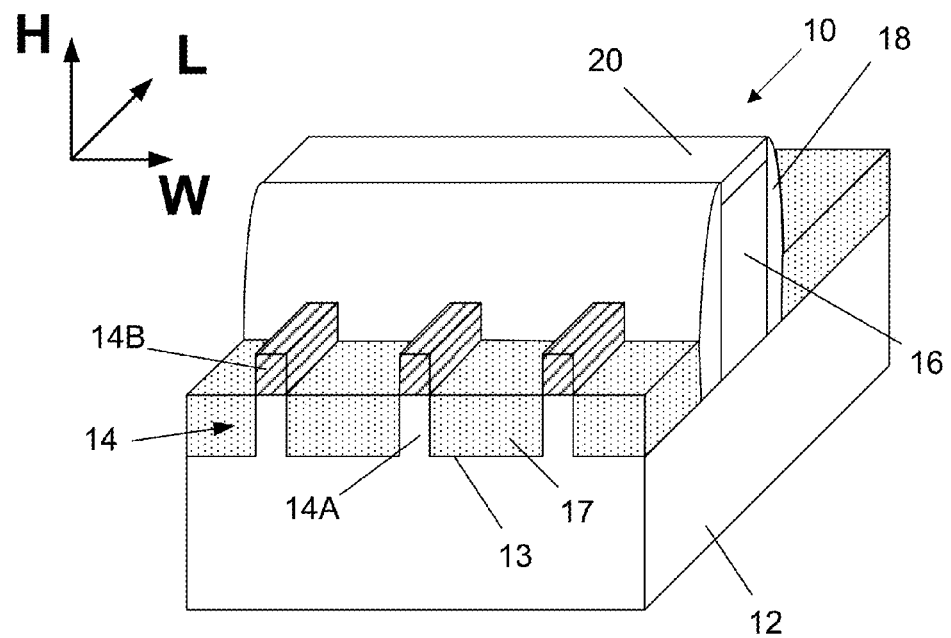
FIG. 1B depicts an example of prior art FinFET devices wherein the fins for the device are comprised of an alternative fin material formed above a substrate fin.
Figure 1C:
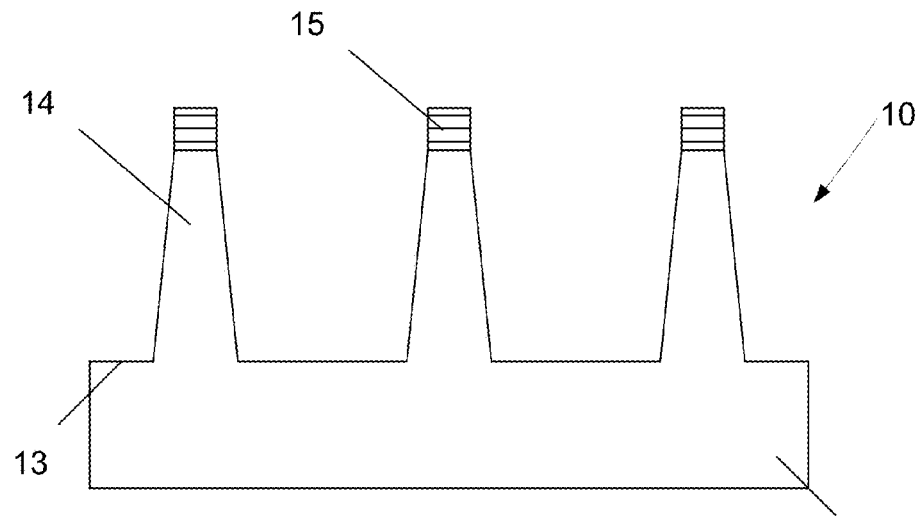
FIGS. 1C-1I depict one illustrative prior art process flow for forming replacement fins comprised of alternative fin materials on FinFET devices.
Figure 1D:
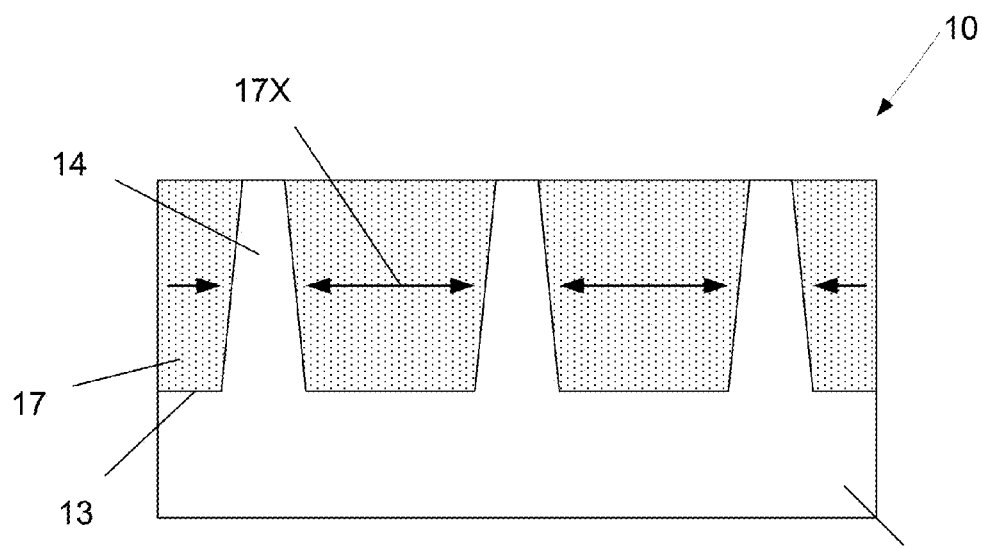
Figure 1E:
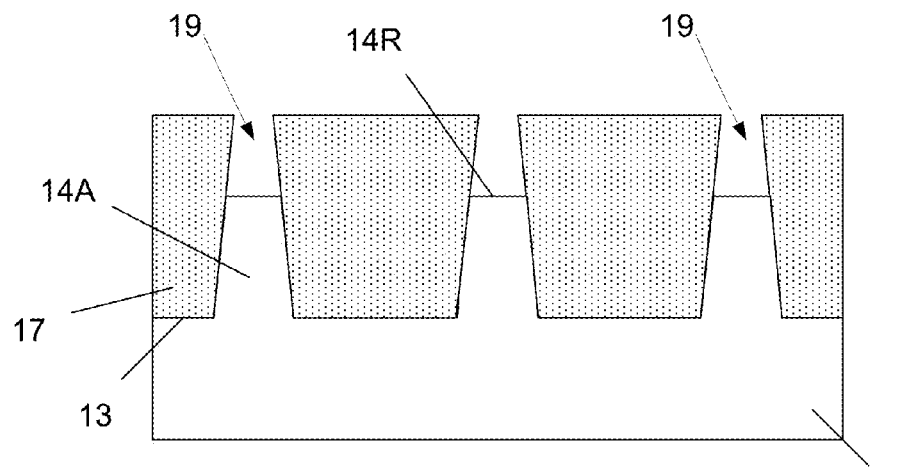
Figure 1F:
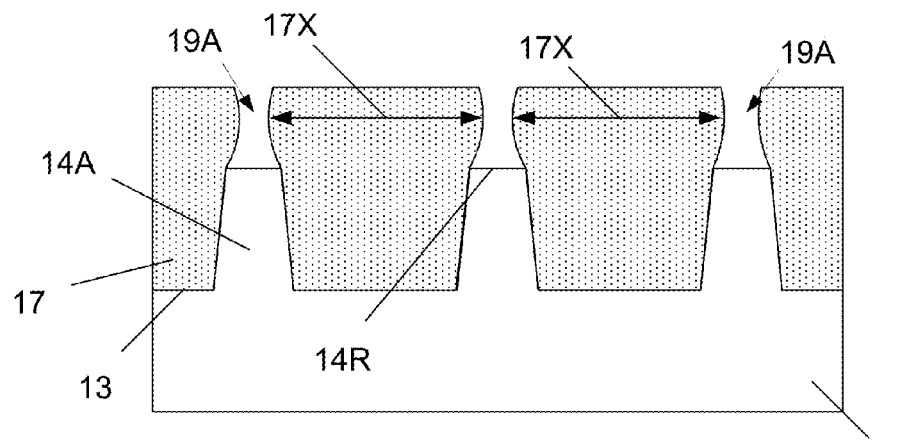
Figure 1G:
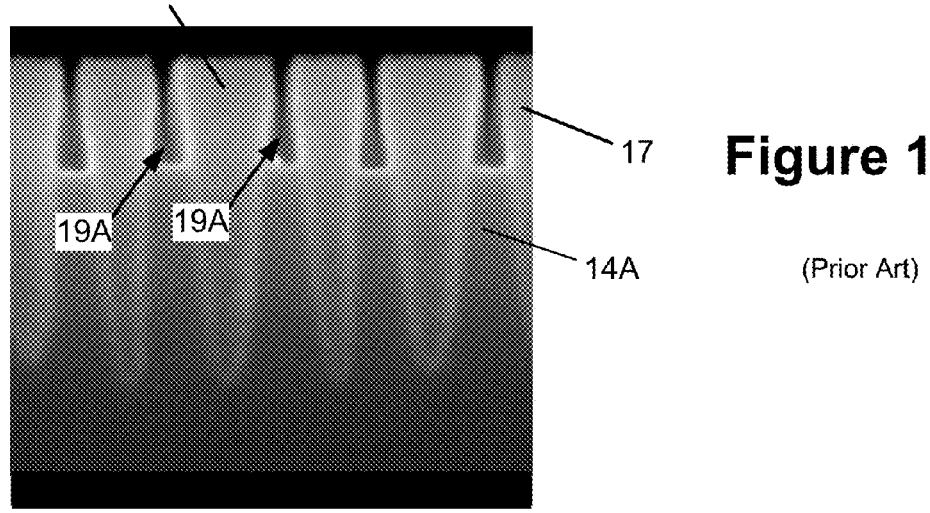
Figure 1H:
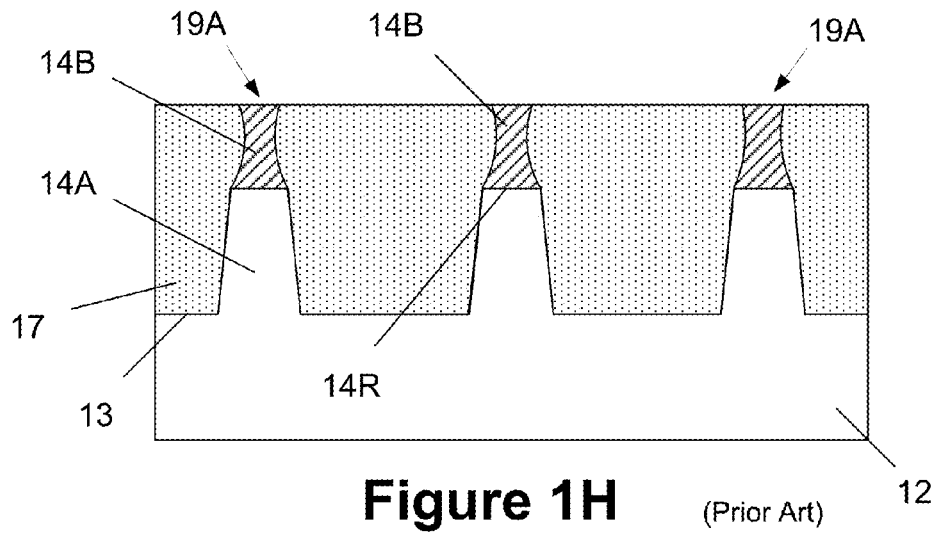
Figure 1I:
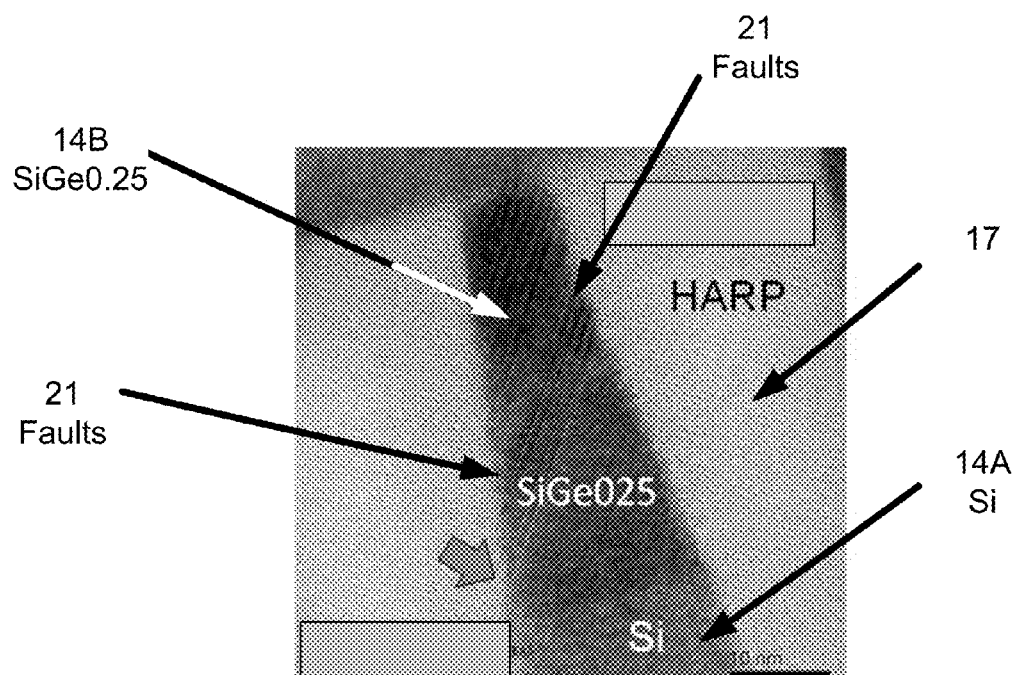

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to methods of forming replacement fins for a FinFET device. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
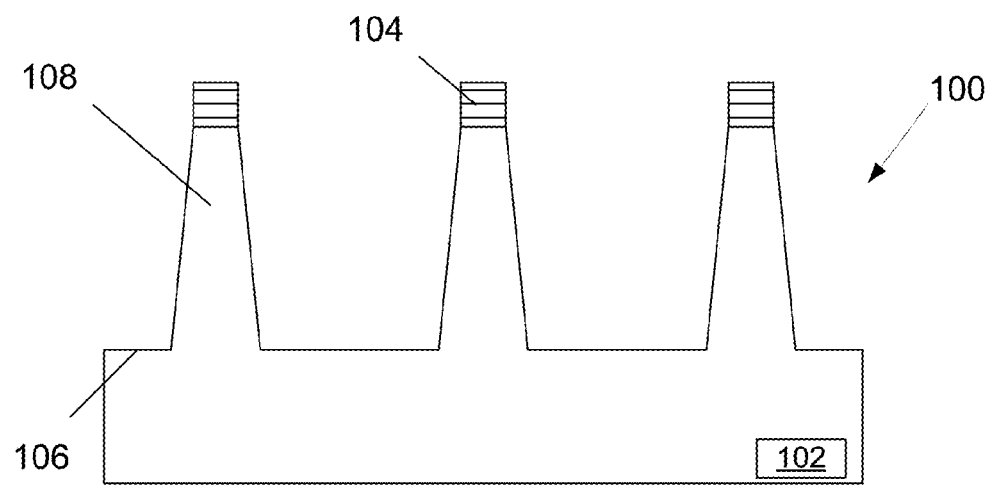
FIGS. 2A-2I depict various illustrative novel methods disclosed herein of forming replacement fins for a FinFET device.

FIGS. 2A-2I depict various illustrative novel methods disclosed herein of forming replacement fins for a FinFET device. With reference to FIG. 2A, the device 100 is depicted as being formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials. An isolation material (not shown) may be formed in the substrate 102 to define spaced-apart active regions in the substrate 102. The isolation regions may be formed using traditional techniques, e.g., traditional shallow trench isolation regions may be formed in the substrate 102. In the case of the illustrative FinFET devices disclosed herein, the isolation regions may be formed after the formation of the fin structures that will be formed as described more fully below.

FIG. 2A depicts the device 100 after several process operations were performed. First, a patterned fin etch mask 104 was formed above the substrate 102. Then, one or more etching processes, e.g., anisotropic etching processes, were performed through the patterned fin etch mask 104 to thereby define a plurality of fin-formation trenches 106 in the substrate 102 that define a plurality of substrate fins 108. The patterned fin etch mask 104 is intended to be representative in nature in that it may be formed using a variety of different materials, e.g., hard mask material or photoresist material, and it may be formed using a variety of known techniques, including, but not limited to well-known sidewall image transfer techniques, which is the current state-of-the-art means of achieving tight fin pitches substantially below 100 nm. The patterned fin etch mask 104 may be comprised of one or more layers of material, e.g., in the case where the substrate is silicon, the patterned fin etch mask 104 may be comprised of a first layer of silicon dioxide (pad oxide) that is formed on the substrate 102 and a second layer of silicon nitride (pad nitride) that is formed on the layer of silicon dioxide. The width and height of the substrate fins 108 may vary depending upon the particular application. Additionally, the overall size, shape and configuration of the trenches 106 and substrate fins 108 may vary depending on the particular application. In one illustrative embodiment, based on current day technology, the depth of the trenches 106 may range from approximately 50-150 nm and the width of the trenches 106 may be about 30 nm or less. In some embodiments, the substrate fins 108 may have a final lateral width within the range of about 10 nm. Of course, the above numbers are provided by way of example, and the formation of the substrate fins 108 should not be considered to be limited to such examples.

In the illustrative examples depicted in the attached drawings, the trenches 106 and the substrate fins 108 are all depicted as having a uniform size and shape. However, such uniformity in the size and shape of the trenches 106 and the substrate fins 108 is not required to practice at least some aspects of the inventions disclosed herein. In the attached figures, the trenches 106 are depicted as having been formed by performing an anisotropic etching process that results in the substrate fins 108 having a schematically depicted, generally tapered cross-sectional configuration. In an actual real-world device, the sidewalls of the substrate fins 108 may vary from the configuration of the substrate fins 108 depicted in the attached drawings. Thus, the size and configuration of the trenches 106 and the substrate fins 108, and the manner in which they are made, should not be considered a limitation of the present invention. Of course, the device 100 may be formed with any desired number of substrate fins 108.

Figure 2B:
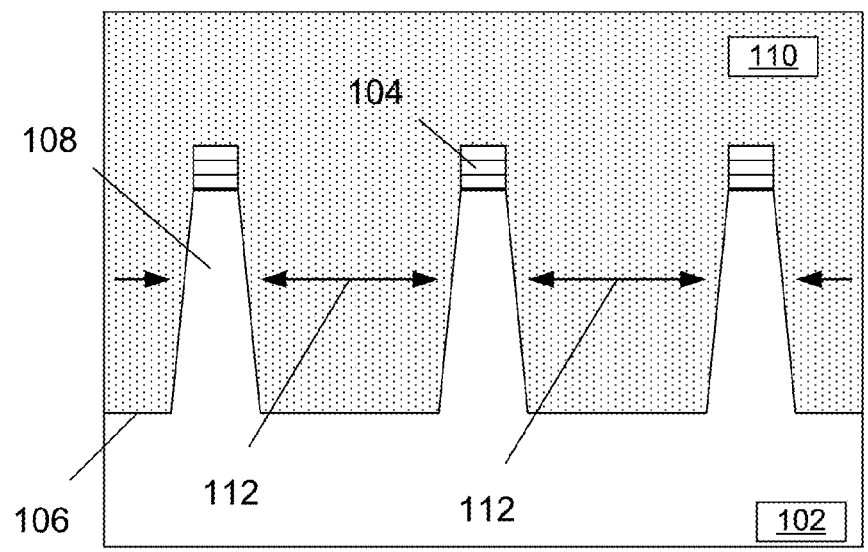

FIG. 2B depicts the device 100 after a layer of insulating material 110, e.g., silicon dioxide, a HARP oxide, was formed so as to over-fill the trenches 106. The layer of insulating material 110 may be made of a variety of materials and it may be formed using any of a variety of different techniques, e.g., chemical vapor deposition (CVD). Additionally, in some embodiments, an anneal process (e.g., 900° C.+) may be performed after the layer of insulating material 110 is formed so as to densify the insulating material 110. In one illustrative embodiment disclosed herein, the layer of insulating material 110 may be a layer of additive-free silicon dioxide material that is substantially free of additional materials, e.g., the layer 110 may be a layer of substantially pure $SiO_2$ instead of a nitrided layer of $SiO_2$. Silicon dioxide is frequently used as the material for the layer of insulating material 110. Silicon dioxide has a linear coefficient of thermal expansion (CTE) of about 0.5 (E-6/° K), whereas a silicon substrate has a CTE of about 2.6 (E-6/° K). When the anneal process is performed, the difference in the CTEs of the materials causes a compressive force 112 to be exerted on the substrate fins 108 due to the greater attempted expansion of the silicon dioxide material.

Figure 2C:
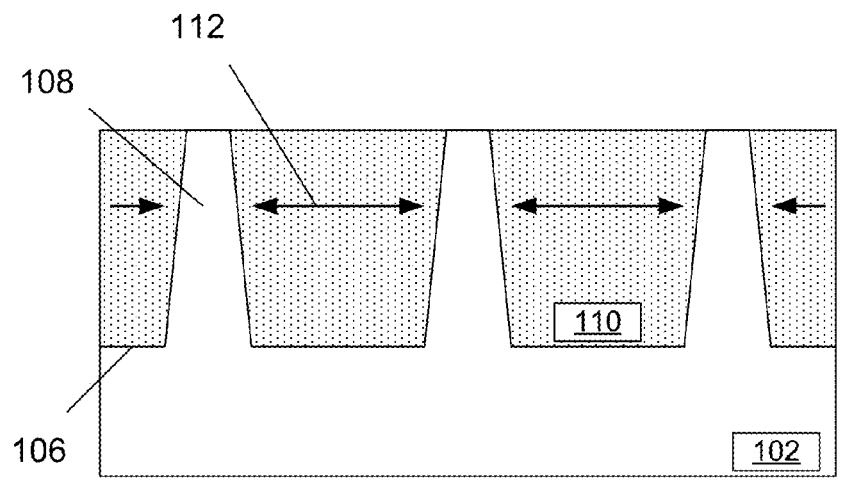

FIG. 2C depicts the device 100 after one or more chemical mechanical polishing (CMP) process operations were performed to remove the patterned fin etch mask 104 and portions of the layer of insulating material 110, thereby exposing the upper surface of the substrate fins 108. In some embodiments, the patterned fin etch mask 104 may be removed prior to the formation of the layer of insulating material 110.

Figure 2D:
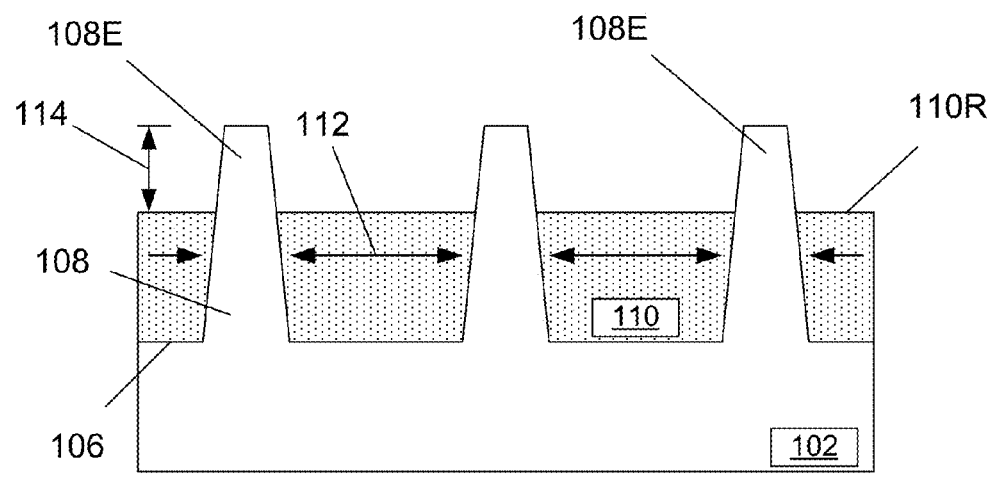

FIG. 2D depicts the device 100 after a recess etching process was performed on the layer of insulating material 110 to reduce its thickness and thereby result in the layer of insulating material 110 having a recessed surface 110R. This recess etching process exposes an upper portion 108E of the substrate fins 108 above the recessed surface 110R of the layer of insulating material 110. As a result of recessing the layer of insulating material 110, the upper portion 108E of the substrate fin 108 is no longer subjected to the compressive stress 112 caused by the layer of insulating material 110, i.e., the upper portion 108E of the fin relaxes. The vertical height 114 of the exposed upper portion 108E may vary depending upon the particular application and, in one illustrative embodiment, may range from about 30-50 nm.

Figure 2E:
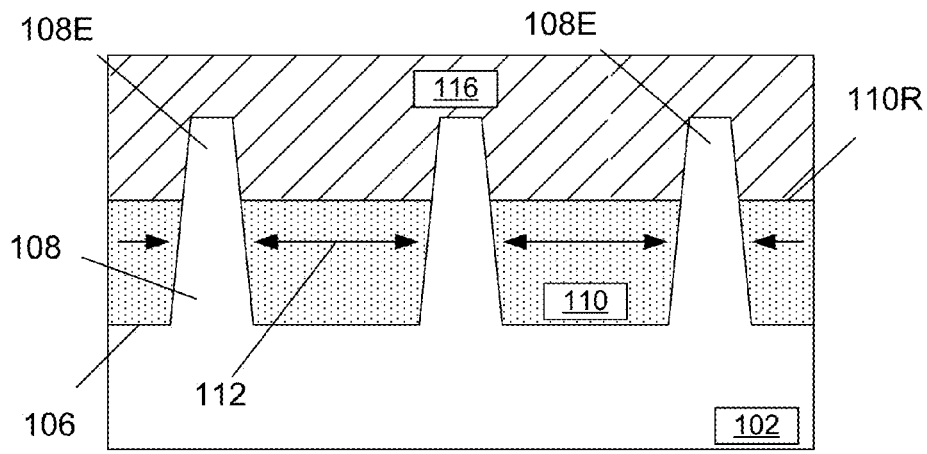

FIG. 2E depicts the device 100 after a layer of CTE-matching material 116 was formed around the exposed upper portion 108E of the substrate fin 108 and above the recessed upper surface 110R of the layer of insulating material 110. As used herein and in the claims, a "CTE-matching material" is one wherein the material of the layer of CTE-matching material 116 has a CTE that is within +/−20% of the CTE of the material that is used for the replacement fin 120 that will be later formed, as more fully described below. In general, the layer of CTE-matching material 116 should be a material that exhibits good etch selectivity relative to the material of the substrate fin 108, the layer of insulating material 110 and the replacement fin 120. In one illustrative embodiment, the layer of CTE-matching material 116 should be formed so as to be in a substantially stress-free condition, i.e., little to no internal tensile or compressive stress in the layer of CTE-matching material 116. The layer of CTE-matching material 116 may be comprised of a variety of different materials depending upon the materials of the substrate 102, the replacement fin 120 and the layer of insulating material 110. For example, the layer of CTE-matching material 116 may be comprised of insulator-type materials such as silicon nitride, carbon-doped $SiO_2$, or a semiconductor material or semiconductor alloy such as Ge, GaAs, SiC, $SiGe_{0.25}$, $SiGe_{0.5}$, $SiGe_{0.75}$, InP, AlN, including single crystal, poly crystal and amorphous versions of those materials such as amorphous polysilicon, amorphous SiGe, amorphous Ge, etc. Additionally, the layer of CTE-matching material 116 may be formed by any desired technique, e.g., physical vapor deposition (PVD), CVD, epi growth, etc. Thus, the exact material selected for the layer of CTE-matching material 116 and the manner in which that layer of CTE-matching material 116 is formed should not be considered to be a limitation of the present invention as long as it is a CTE-matching material as defined above. The techniques for measuring the CTE of various materials are well known to those skilled in the art. Importantly, according to one aspect of the method disclosed herein, the CTE of the replacement fin 120 material is first identified, then the material for the layer 116 is specifically and intentionally selected such that it has a CTE that is within +/−20% of the CTE of the material that is to be used for the replacement fin 120 and such that the layer 116 is made of a material that may be selectively etched and removed relative to the material of the replacement fin 120 and relative to the material of the layer of insulating material 110 in a single etching process.

Figure 2F:
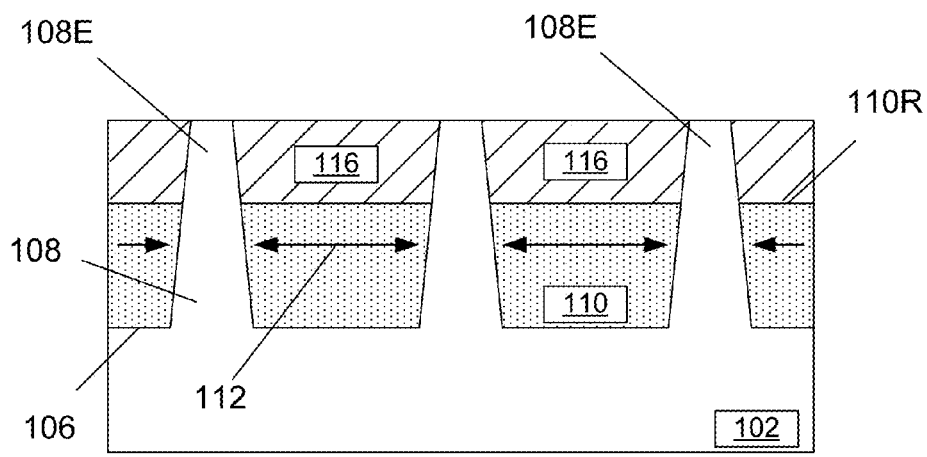

FIG. 2F depicts the device 100 after one or more chemical mechanical polishing (CMP) process operations were performed to remove portions of the layer of CTE-matching material 116, thereby exposing the upper surface of the substrate fins 108.

Figure 2G:
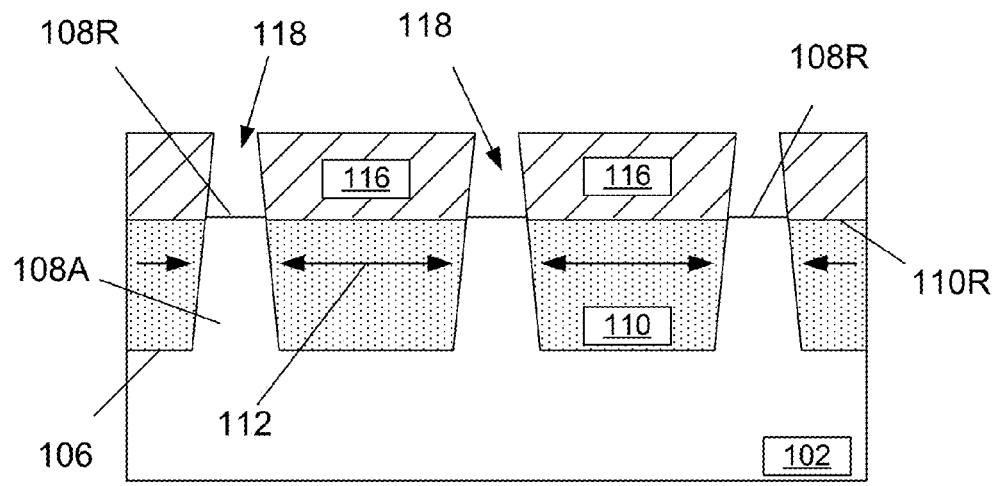

FIG. 2G depicts the device 100 after a fin-recessing etch process was performed to remove at least a portion of the upper portion 108E of the substrate fin 108 relative to the surrounding materials so as to thereby define a plurality of replacement fin cavities 118 in at least the layer of CTE-matching material 116. The formation of the replacement fin cavities 118 exposes the upper surface 108R of the substrate fins 108 within each of the replacement fin cavities 118. However, unlike the prior art technique discussed in the background section of this application, by use of the layer of CTE-matching material 116, when the replacement fin cavities 118 are formed (by removing portions of the upper portion 108E of the substrate fins 108), they do not tend to reduce or shrink in size as was the case when the replacement cavities were formed in a layer of silicon dioxide, which has a significantly different CTE as compared to the CTE of silicon.

Figure 2H:
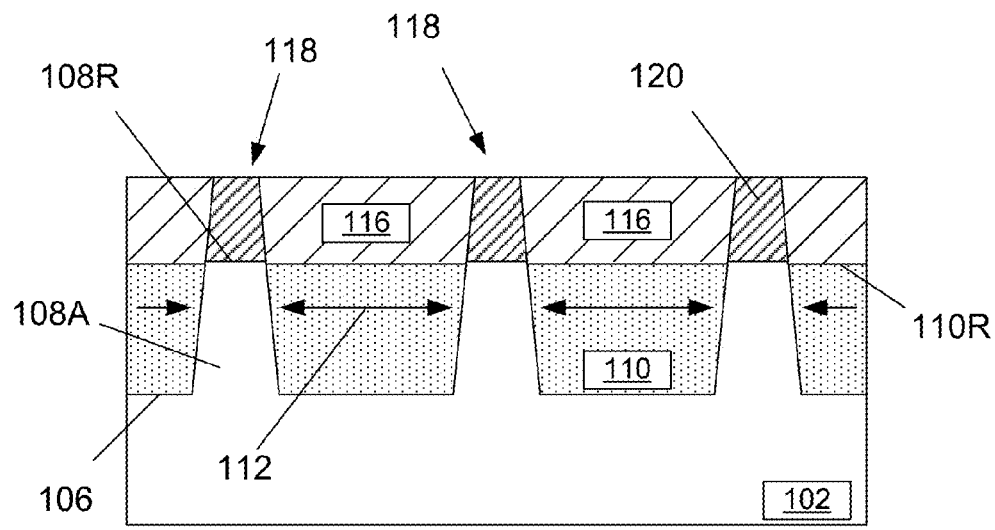

FIG. 2H depicts the device 100 after several process operations were performed. First, an epitaxially grown layer of semiconductor material that constitutes replacement fins 120 was formed in the fin cavities 118 using the exposed surface 108R of the substrate fins 108 as a starting surface with respect to formation of the replacement fins 120. The replacement fins 120 may be formed so as to flush-fill the replacement fin cavities 118 or so as to only fill a portion of the replacement fin cavities 118. The replacement fins 120 may be formed using traditional epitaxial deposition tools and techniques, and they may be formed to any desired thickness. Moreover, the critical thickness of the material of the replacement fins may be exceeded due to the confined growth of the replacement fin material within the replacement fin cavities 118. The replacement fins 120 may be made of a variety of different materials, e.g., germanium, silicon, silicon germanium, a III-V material or compounds thereof. Due to the fact that the replacement fin cavities 118 are defined, in part, by the layer of CTE-matching material 116, the cavities 118 do not "shrink" in size when the upper portion 108E of the substrate fin 108 is removed to define the replacement fin cavities 118. Moreover, when the replacement fins 120 are formed in the replacement fin cavities 118 adjacent the layer of CTE-matching material 116, there is a lesser chance of formation of defects in the replacement fins 120 during epi growth and the subsequent cool-down due to the relatively smaller difference between the CTEs of the replacement fin material and the material of the layer of CTE-matching material 116.

Figure 2I:
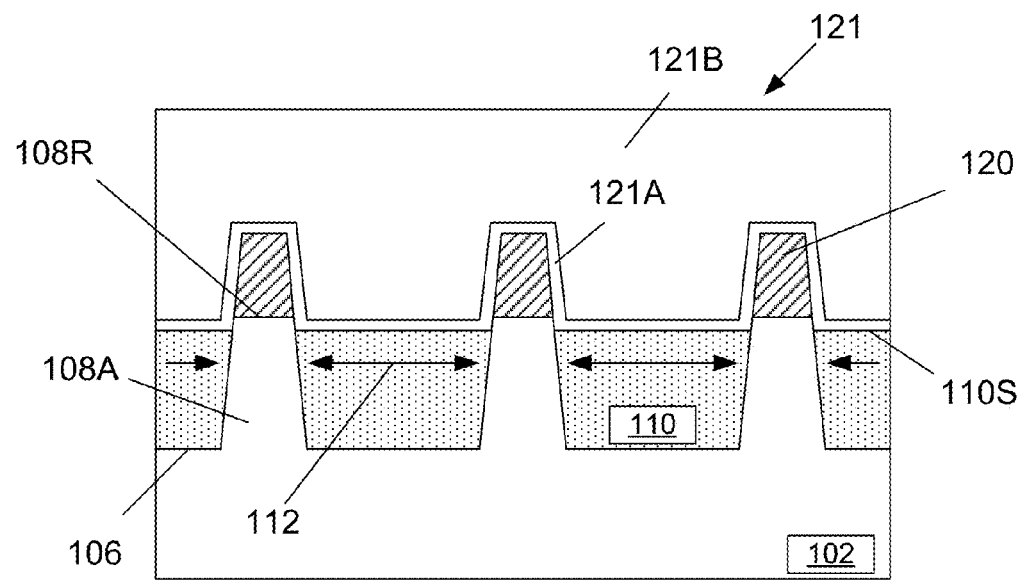

FIG. 2I depicts the device 100 after several process operations were performed. First, a selective etching process was performed so as to remove the layer of CTE-matching material 116 selectively relative to the surrounding materials, i.e., relative to the substrate fin 108, the layer of insulating material 110 and the replacement fin 120. After removal of the layer of CTE-matching material 116, if desired, a brief recess etching process may be performed on the layer of insulating material 110 to further reduce its thickness such that it has a recessed surface 110S so as to insure that the entire replacement fin 120 is exposed. Thereafter, an illustrative gate structure 121 has been formed for the device 100. In one illustrative embodiment, the schematically depicted gate structure 121 includes an illustrative gate insulation layer 121A and an illustrative gate electrode 121B. The gate insulation layer 121A may be comprised of a variety of different materials, such as, for example, silicon dioxide, a so-called high-k (k greater than 10) insulation material (where k is the relative dielectric constant), etc. Similarly, the gate electrode 121B may also be of a material such as polysilicon or amorphous silicon, or it may be comprised of one or more metal layers that act as the gate electrode 121B. As will be recognized by those skilled in the art after a complete reading of the present application, the gate structure 121 of the device 100 depicted in the drawings, i.e., the gate insulation layer 121A and the gate electrode 121B, is intended to be representative in nature. That is, the gate structure 121 may be comprised of a variety of different materials and it may have a variety of configurations, and the gate structure 121 may be made using either the so-called "gate-first" or "replacement gate" techniques.

FIGS. 3A-3G depict other illustrative novel methods disclosed herein of forming replacement fins for a FinFET device that involve use of a patterned fin etch mask 122 having a thickness that is equal to or greater than the target final fin height 120H for the replacement fin 120.

Figure 3A:
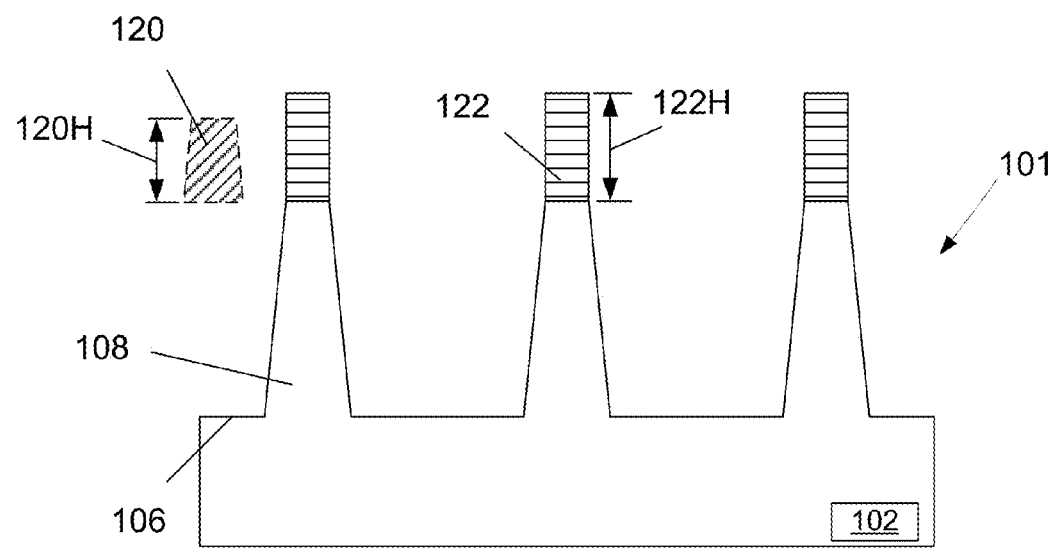
FIGS. 3A-3G depict other illustrative novel methods disclosed herein of forming replacement fins for a FinFET device that involve use of a patterned fin etch mask having a thickness that is equal to or greater than the target final fin height for the replacement fin.

With reference to FIG. 3A, the device 101 is depicted after several process operations were performed. First, a patterned fin etch mask 122 was formed above the substrate 102. Then, one or more etching processes, e.g., anisotropic etching processes, were performed through the patterned fin etch mask 122 to thereby define the fin-formation trenches 106 in the substrate 102 that define the substrate fins 108. In this embodiment, the patterned fin etch mask 122 has a thickness or height 122H that is equal to or greater than the target final fin height 120H for the replacement fin 120 (shown in dashed lines in FIG. 3A). In one illustrative embodiment, the thickness 122H of the patterned fin etch mask 122 may fall within the range of about 30-50 nm. Other than having its thickness 122H specifically selected to be equal to or greater than the target final fin height 120H for the replacement fin 120, the patterned fin etch mask 122 is intended to be representative in nature in that it may be formed using a variety of different materials, e.g., hard mask material or photoresist material, and it may be formed using a variety of known techniques, including, but not limited to well-known sidewall image transfer techniques, which is the current state-of-the-art means of achieving tight fin pitches substantially below 100 nm. The patterned fin etch mask 122 may be comprised of one or more layers of material, e.g., in the case where the substrate is silicon, the patterned fin etch mask 122 may be comprised of a first layer of silicon dioxide (pad oxide) that is formed on the substrate 102 and a second relatively thick layer of silicon nitride (pad nitride) that is formed on the layer of silicon dioxide. As before, the overall size, shape and configuration of the trenches 106 and substrate fins 108 may vary depending on the particular application.

Figure 3B:
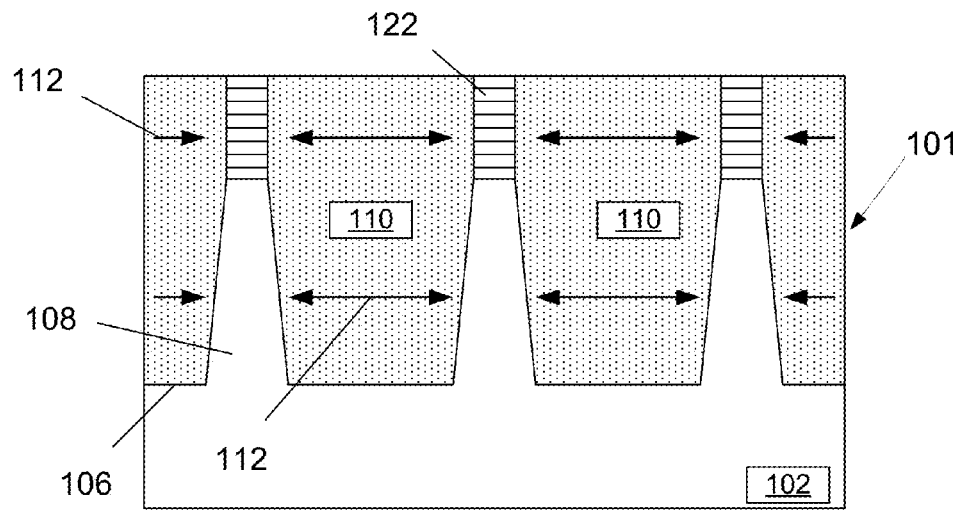

FIG. 3B depicts the device 101 after the above-described layer of insulating material 110, e.g., silicon dioxide, a HARP oxide, was formed so as to over-fill the trenches 106, after an anneal process was performed and after a CMP process was performed using the patterned fin etch mask 122 as a polish-stop layer. As before, due to differences in the CTEs of the materials of the substrate 102 and the patterned fin etch mask 122, a compressive force 112 is exerted on the substrate fins 108.

Figure 3C:
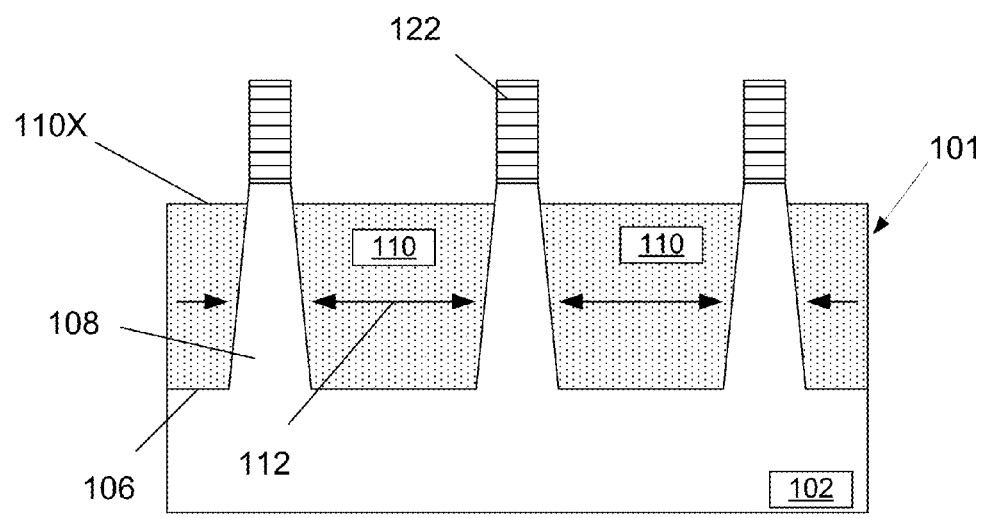

FIG. 3C depicts the device 101 after a recess etching process was performed on the layer of insulating material 110 to reduce its thickness and thereby result in the layer of insulating material 110 having a recessed surface 110X. This recess etching process exposes the patterned fin etch mask 122 above the recessed surface 110X of the layer of insulating material 110. As a result of recessing the layer of insulating material 110, the patterned fin etch mask 122 is no longer subjected to the compressive stress 112 caused by the layer of insulating material 110.

Figure 3D:
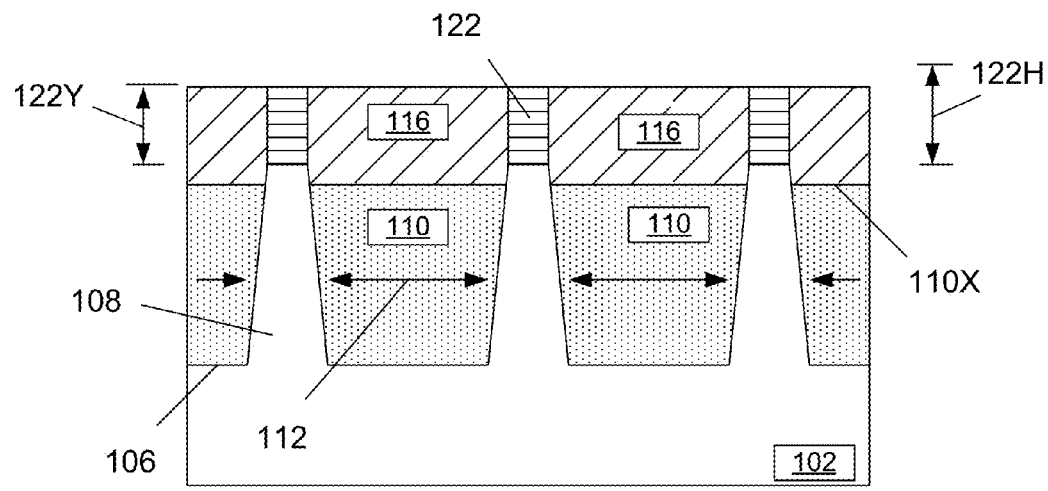

FIG. 3D depicts the device 101 after several process operations were performed. First, the above-described layer of CTE-matching material 116 was formed around the patterned fin etch mask 122 and above the recessed upper surface 110R of the layer of insulating material 110. Then, a CMP process was performed to planarize the upper surface of the layer of CTE-matching material 116 and to expose the patterned fin etch mask 122. During this planarization process, the initial thickness 122H of the patterned fin etch mask 122 may be reduced to a lesser thickness 122Y, as depicted in the drawing. As shown more fully below, this post-CMP thickness 122Y will correspond approximately to the final active fin height 120H of the replacement fins 120.

Figure 3E:
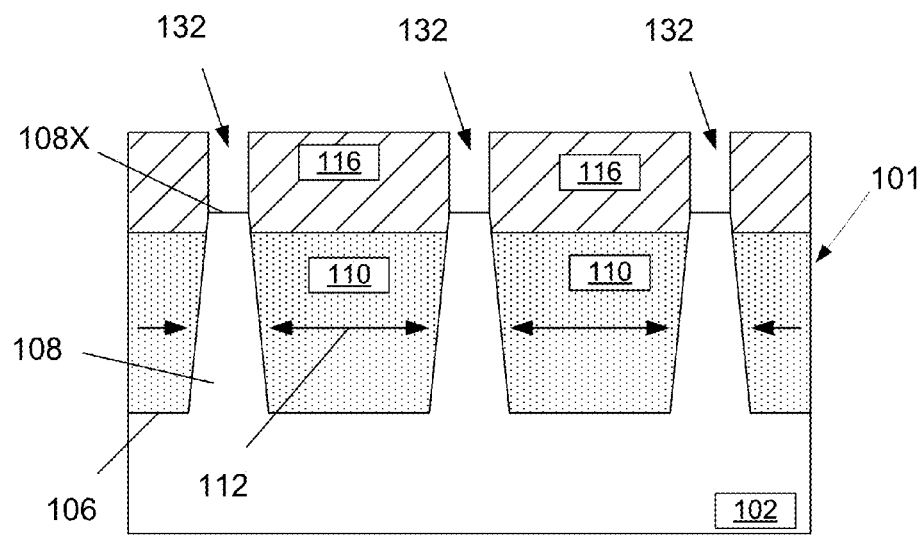

FIG. 3E depicts the device 101 after an etch process was performed to remove the patterned fin etch mask 122 and thereby result in the definition of a plurality of replacement fin cavities 132 in the layer of CTE-matching material 116. The formation of the replacement fin cavities 132 exposes an upper surface 108X of the substrate fins 108 within each of the replacement fin cavities 132. However, unlike the prior art technique discussed in the background section of this application, by use of the layer of CTE-matching material 116, when the replacement fin cavities 132 are formed (by removing the patterned fin etch mask 122 of the substrate fins 108), they do not tend to reduce or shrink in size as was the case when the replacement cavities were formed in a layer of silicon dioxide, which has a significantly different CTE as compared to the CTE of silicon.

Figure 3F:
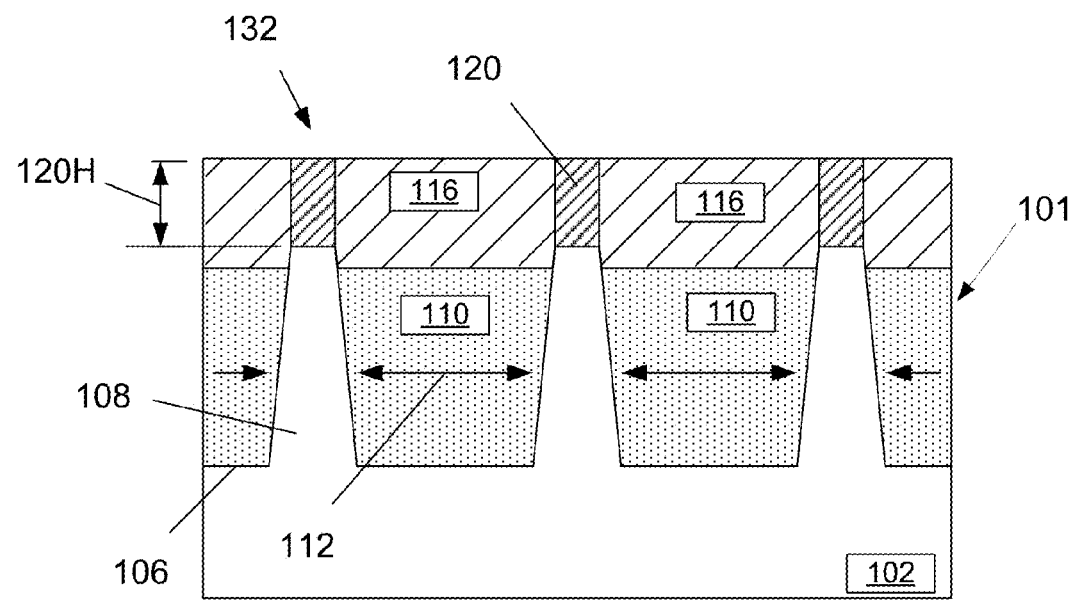

FIG. 3F depicts the device 101 after several process operations were performed. First, as before, an epitaxially grown layer of semiconductor material that constitutes the above-described replacement fins 120 was formed in the fin cavities 132 using the exposed surface 108X of the substrate fins 108 as a starting surface with respect to formation of the replacement fins 120. As noted above, the replacement fins 120 may be formed so as to flush-fill the replacement fin cavities 132 or so as to only fill a portion of the replacement fin cavities 132. As with the prior embodiment, due to the fact that the replacement fin cavities 132 are defined, in part, by the layer of CTE-matching material 116, the cavities 132 do not "shrink" in size when the patterned fin etch mask 122 is removed to define the replacement fin cavities 132. Moreover, when the replacement fins 120 are formed in the replacement fin cavities 132 adjacent the layer of CTE-matching material 116, there is a lesser chance of formation of defects in the replacement fins 120 during epi growth and the subsequent cool-down due to the relatively smaller difference between the CTEs of the replacement fin material and the material of the layer of CTE-matching material 116.

Figure 3G:
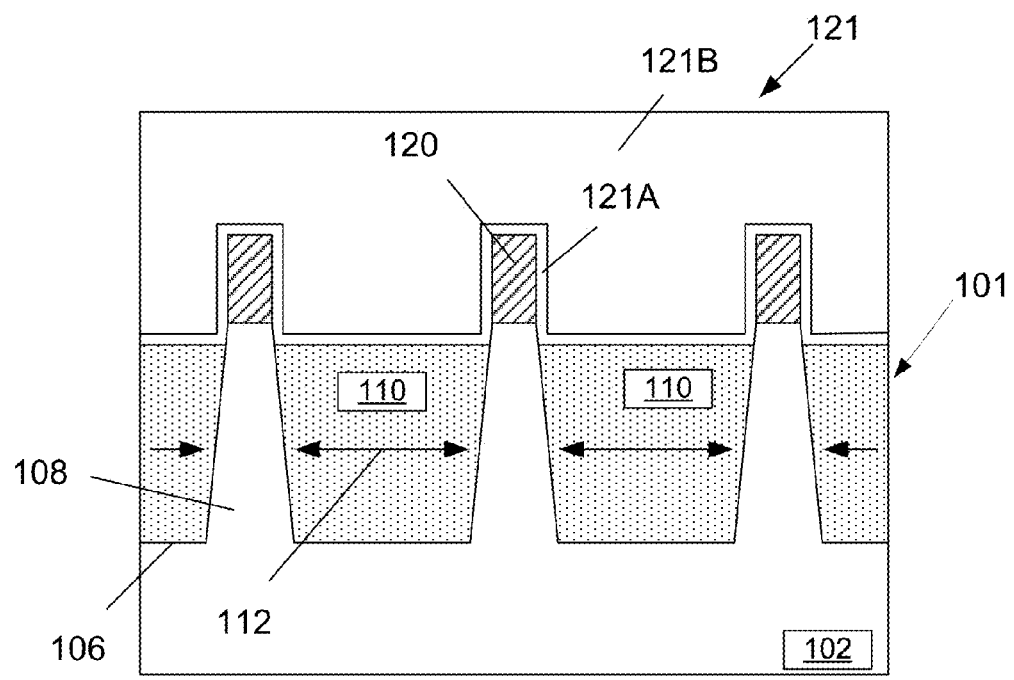

FIG. 3G depicts the device 101 after several process operations were performed. First, a selective etching process was performed so as to remove the layer of CTE-matching material 116 selectively relative to the surrounding materials, i.e., relative to the substrate fin 108, the layer of insulating material 110 and the replacement fin 120. After removal of the layer of CTE-matching material 116, if desired, a brief recess etching process may be performed on the layer of insulating material 110 to further reduce its thickness. Thereafter, the above-described illustrative gate structure 121 was formed for the device 101.

As will be appreciated by those skilled in the art, the novel methods disclosed herein provide unique advantages as it relates to forming replacement fins for FinFET devices. Table 1 depicts various materials and their coefficient of thermal expansion (E-6/° K). As will be recalled from the background section of this application, where the layer of insulating material is made of silicon dioxide (CTE=0.5), the substrate is made of silicon (CTE=2.6), and the replacement fins are made of $SiGe_{0.25}$ (CTE=3.4) or pure Ge (CTE=5.8), the difference in the CTEs of the layer of silicon dioxide 17 and the material of the replacement fin 14B ranged between about 2.9-5.3, respectively. Table 2 depicts the reduced CTE differences (−0.4 to +0.4) that may be achieved using the novel layer of CTE-matching material 116 disclosed herein with some illustrative material combinations. Of course, the present invention should not be considered to be limited to the illustrative examples shown below. By reducing the CTE mismatch between material of the replacement fin and the material adjacent the replacement fin when the replacement fin is formed, replacement fins may be formed with fewer defects.

TABLE 1

| Material | CTE (E-6/° K.) |
| --- | --- |
| $SiO_2$ | 0.5 |
| Si | 2.6 |
| SiC | 2.7 |
| $Si_3N_4$ | 3.3 |
| $SiGe_{0.25}$ | 3.4 |
| $SiGe_{0.50}$ | 4.2 |
| InP | 4.6 |
| $SiGe_{0.75}$ | 5 |
| AlN | 5.3 |

TABLE 1-continued

| Material | CTE (E-6/° K.) |
| --- | --- |
| GaAs | 5.8 |
| Ge | 5.8 |

TABLE 2

| Substrate 102 Material | CTE Matched Layer 116 Material (CTE) | Replacement Fin 120 Material (CTE) | Delta CTEs (116 vs. 120) |
| --- | --- | --- | --- |
| Silicon | $Si_3N_4$ (3.3) | $SiGe_{0.25}$ (3.4) | −0.1 |
| Silicon | InP (4.6) | $SiGe_{0.50}$ (4.2) | 0.4 |
| Silicon | AlN (5.3) | $SiGe_{0.75}$ (5) | 0.3 |
| Silicon | GaAs (5.8) | Ge (5.8) | 0 |
| Silicon | $SiGe_{0.50}$ (4.2) | InP (4.6) | −0.4 |
| Silicon | Ge (5.8) | GaAs (5.8) | 0 |

PRIOR ART

| Substrate 12 Material | Insulating Layer 17 Material (CTE) | Replacement Fin 14B Material (CTE) | Delta CTEs (17 vs. 14B) |
| --- | --- | --- | --- |
| Silicon | $SiO_2$ (0.5) | $SiGe_{0.25}$ (3.4) | 2.9 |
| Silicon | $SiO_2$ (0.5) | Ge (5.8) | 5.3 |

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device comprised of a replacement fin made of a material having a replacement fin coefficient of thermal expansion (replacement fin CTE) and a target final fin height for said replacement fin, the method comprising:

forming a patterned fin etch mask above a semiconductor substrate, said patterned fin etch mask having a thickness that is equal to or greater than said target final fin height for said replacement fin;

performing an etching process through said patterned fin etch mask to form a plurality of trenches in said semiconductor substrate so as to define a substrate fin;

with said patterned fin etch mask in position, forming a layer of insulating material in said trenches;

recessing said layer of insulating material so as to expose said patterned fin etch mask above a recessed upper surface of said layer of insulating material;

forming a layer of CTE-matching material around said exposed patterned fin etch mask and above said recessed upper surface of said layer of insulating material, said layer of CTE-matching material having a CTE that is within ±20% of said replacement fin CTE;

removing said patterned fin etch mask so as to thereby define a replacement fin cavity in at least said layer of CTE-matching material and expose a surface of said substrate fin;

forming said replacement fin on said substrate fin and in said replacement fin cavity;

removing said layer of CTE-matching material; and forming a gate structure around at least a portion of said replacement fin.

2. The method of claim 1, wherein forming said patterned fin etch mask comprises forming said patterned fin etch mask to a thickness that falls within a range of 30-50 nm.

3. The method of claim 1, wherein forming said patterned fin etch mask comprises forming said patterned fin etch mask from a single layer of material.

4. The method of claim 1, wherein forming said patterned fin etch mask comprises forming said patterned fin etch mask from a plurality of layers of material.

5. The method of claim 1, wherein forming said layer of CTE-matching material comprises forming a layer made of one of the following: an insulating material, silicon nitride, carbon-doped $SiO_2$, a semiconductor material, a semiconductor alloy, Ge, GaAs, SiC, $SiGe_{0.25}$, $SiGe_{0.5}$, $SiGe_{0.75}$, InP, AlN, including single crystal, poly crystal and amorphous versions of such materials such as amorphous polysilicon, amorphous SiGe or amorphous Ge.

6. The method of claim 1, wherein forming said layer of CTE-matching material comprises performing an epitaxial deposition process to form said layer of CTE-matching material.

7. The method of claim 1, wherein forming said layer of CTE-matching material comprises performing a chemical vapor deposition (CVD) or physical vapor deposition (PVD) process to form said layer of CTE-matching material.

8. The method of claim 1, wherein forming said replacement fin comprises performing an epitaxial deposition process to form a replacement fin comprised of one of germanium, silicon, silicon germanium, a III-V material or compounds of III-V materials.

9. The method of claim 1, wherein forming said layer of insulating material comprises forming a layer of silicon dioxide material.

10. The method of claim 1, wherein forming said layer of insulating material comprises forming a layer of silicon dioxide material by performing a HARP process.

11. The method of claim 1, wherein, prior to recessing said layer of insulating material, the method further comprises performing an anneal process at a temperature of at least 900° C. so as to densify said layer of insulating material.

12. The method of claim 1, wherein forming said replacement fin in said replacement fin cavity comprises performing an epitaxial deposition process.

13. The method of claim 1, wherein forming said gate structure comprises:

forming a high-k gate insulation layer around said replacement fin; and forming at least one layer of metal above said high-k gate insulation layer.

14. The method of claim 1, wherein removing said layer of CTE-matching material comprises performing a single etching process so as to selectively remove said layer of CTE-matching material relative to said replacement fin and said layer of insulating material.

15. The method of claim 1, wherein forming said layer of CTE-matching material comprises:

selecting a material for said layer of CTE-matching material based upon a previous identification of said replacement fin CTE; and forming said layer of CTE-matching material of said selected material.

16. A method of forming a FinFET device comprised of a replacement fin made of a material having a replacement fin coefficient of thermal expansion (replacement fin CTE) and a target final fin height for said replacement fin, the method comprising:

forming a patterned fin etch mask above a semiconductor substrate, said patterned fin etch mask having a thickness that is equal to or greater than said target final fin height for said replacement fin;

performing an etching process through said patterned fin etch mask to form a plurality of trenches in said semiconductor substrate so as to define a substrate fin;

with said patterned fin etch mask in position, depositing a layer of silicon dioxide in said trenches;

performing an anneal process at a temperature of at least 900° C. so as to densify said layer of silicon dioxide;

after performing said anneal process, recessing said layer of silicon dioxide so as to expose said patterned fin etch mask above a recessed upper surface of said layer of silicon dioxide;

forming a layer of CTE-matching material around said exposed patterned fin etch mask and above said recessed upper surface of said layer of silicon dioxide, said layer of CTE-matching material having a CTE that is within ±20% of said replacement fin CTE;

performing an etching process to remove said patterned fin etch mask so as to thereby define a replacement fin cavity that is laterally bounded, at least in part, by said layer of CTE-matching material and expose a surface of said substrate fin;

performing an epitaxial deposition process to form said replacement fin on said substrate fin and in said replacement fin cavity;

performing an etching process to remove said layer of CTE-matching material; and forming a gate structure around at least a portion of said replacement fin.

17. The method of claim 16, wherein forming said patterned fin etch mask comprises forming said patterned fin etch mask to a thickness that falls within a range of 30-50 nm.

18. The method of claim 16, wherein forming said layer of CTE-matching material comprises forming a layer made of one of the following: an insulating material, silicon nitride, carbon-doped $SiO_2$, a semiconductor material, a semiconductor alloy, Ge, GaAs, SiC, $SiGe_{0.25}$, $SiGe_{0.5}$, $SiGe_{0.75}$, InP, AlN, including single crystal, poly crystal and amorphous versions of such materials such as amorphous polysilicon, amorphous SiGe or amorphous Ge.

19. The method of claim 16, wherein forming said layer of CTE-matching material comprises performing an epitaxial deposition process to form said layer of CTE-matching material.

20. The method of claim 16, wherein forming said layer of CTE-matching material comprises performing a chemical vapor deposition (CVD) or physical vapor deposition (PVD) process to form said layer of CTE-matching material.

21. The method of claim 16, wherein forming said layer of silicon dioxide comprises forming said layer of silicon dioxide by performing a HARP process.

22. The method of claim 16, wherein forming said layer of silicon dioxide comprises forming a layer of additive-free silicon dioxide material.

23. The method of claim 16, wherein removing said layer of CTE-matching material comprises performing a single etching process so as to selectively remove said layer of CTE-matching material relative to said replacement fin and said layer of silicon dioxide.

24. The method of claim 16, wherein forming said layer of CTE-matching material comprises:
   selecting a material for said layer of CTE-matching material based upon a previous identification of said replacement fin CTE; and
   forming said layer of CTE-matching material of said selected material.

\* \* \* \* \*